(12) United States Patent
Chi et al.

(10) Patent No.: US 9,196,718 B2
(45) Date of Patent: Nov. 24, 2015

(54) IN-SITU NITRIDATION OF GATE DIELECTRIC FOR SEMICONDUCTOR DEVICES

(71) Applicant: Taiwan Semiconductor Manufacturing Co., Ltd., Hsin-Chu (TW)

(72) Inventors: Liang-Chen Chi, Hsinchu (TW); Chia-Ming Tsai, Zhubei (TW); Yu-Min Chang, Hsinchu (TW); Chin-Kun Wang, Hsinchu (TW); Miin-Jang Chen, Taipei (TW); Li-Tien Huang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/771,109

(22) Filed: Feb. 20, 2013

(65) Prior Publication Data
US 2014/0231931 A1    Aug. 21, 2014

(51) Int. Cl.
| H01L 29/78 | (2006.01) |
| H01L 21/02 | (2006.01) |
| H01L 21/28 | (2006.01) |
| H01L 29/51 | (2006.01) |

(52) U.S. Cl.
CPC .............. *H01L 29/78* (2013.01); *H01L 21/022* (2013.01); *H01L 21/0228* (2013.01); *H01L 21/0234* (2013.01); *H01L 21/02181* (2013.01); *H01L 21/02274* (2013.01); *H01L 21/02332* (2013.01); *H01L 21/28202* (2013.01); *H01L 29/513* (2013.01); *H01L 29/517* (2013.01)

(58) Field of Classification Search
CPC .......... H01L 29/78; H01L 21/02; H01L 21/28
USPC ..................................... 257/411; 438/591, 763
See application file for complete search history.

(56) References Cited

U.S. PATENT DOCUMENTS

| 2003/0213987 A1* | 11/2003 | Basceri et al. ................. 257/296 |
| 2008/0315292 A1* | 12/2008 | Ji et al. ............................. 257/324 |
| 2009/0146216 A1* | 6/2009 | Nabatame et al. ............. 257/369 |
| 2009/0152618 A1* | 6/2009 | Matsuo et al. ................. 257/324 |
| 2009/0202710 A1* | 8/2009 | Marcadal et al. ........... 427/126.1 |
| 2010/0072539 A1* | 3/2010 | Yasuda .......................... 257/326 |
| 2011/0147827 A1* | 6/2011 | Simsek-Ege et al. ......... 257/326 |
| 2013/0126986 A1* | 5/2013 | Brodsky et al. ............... 257/411 |

(Continued)

FOREIGN PATENT DOCUMENTS

WO    WO2012034765 A1 *  3/2012

OTHER PUBLICATIONS

Seong, N.J. et al., "Effect of nitrogen incorporation on improvement of leakage properties in high-k HfO2 capacitors treated by N2-plasma", Appl. Phys. Lett, 2005, 87:132903-1-132903-3.

(Continued)

*Primary Examiner* — Christine Enad
(74) *Attorney, Agent, or Firm* — Duane Morris LLP

(57) ABSTRACT

A semiconductor substructure with improved performance and a method of forming the same is described. The semiconductor substructure includes a dielectric film over a substrate, the dielectric film including at least one metal dielectric layer, at least one oxygen-donor layer, and at least one nitride-incorporation layer.

21 Claims, 12 Drawing Sheets

(56) References Cited

U.S. PATENT DOCUMENTS

2013/0279259 A1* 10/2013 Forbes et al. ............ 365/185.18
2013/0292655 A1* 11/2013 Becker et al. .................. 257/40
2014/0017907 A1*  1/2014 Consiglio et al. ............ 438/785
2014/0042546 A1*  2/2014 Ando et al. ................... 257/368

OTHER PUBLICATIONS

Rauf, S. et al., "Model for nitridation of nanoscale SiO2 thin films in pulsed inductively coupled N2 plasma", J. Appl. Phys., 2005, 98:024305-1-024305-10.

* cited by examiner

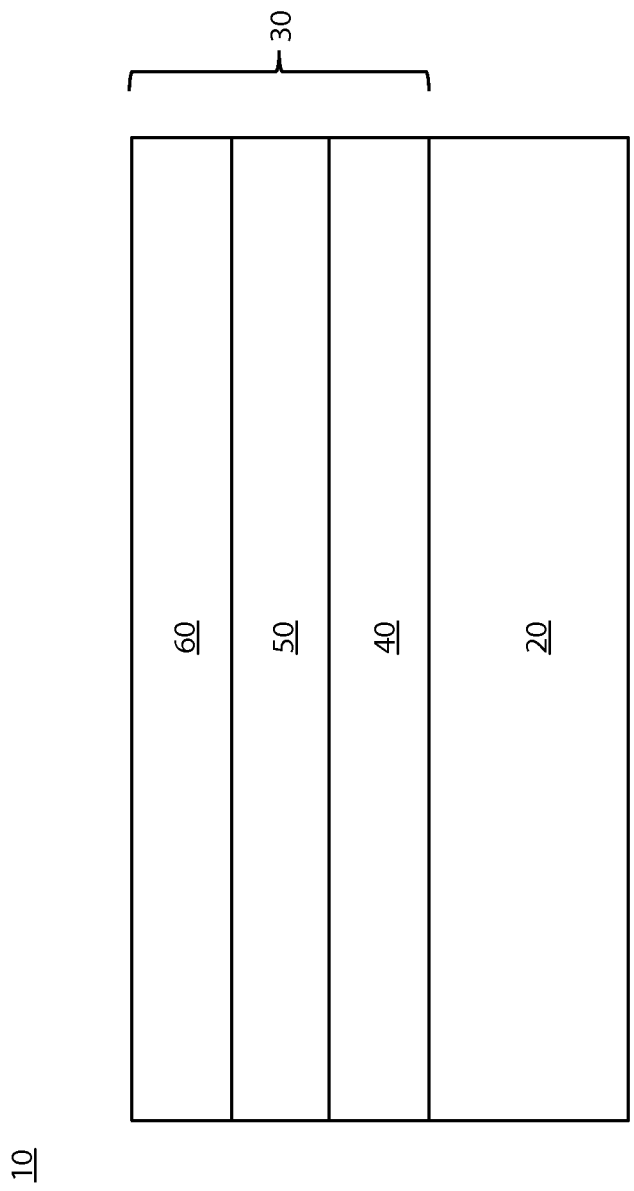

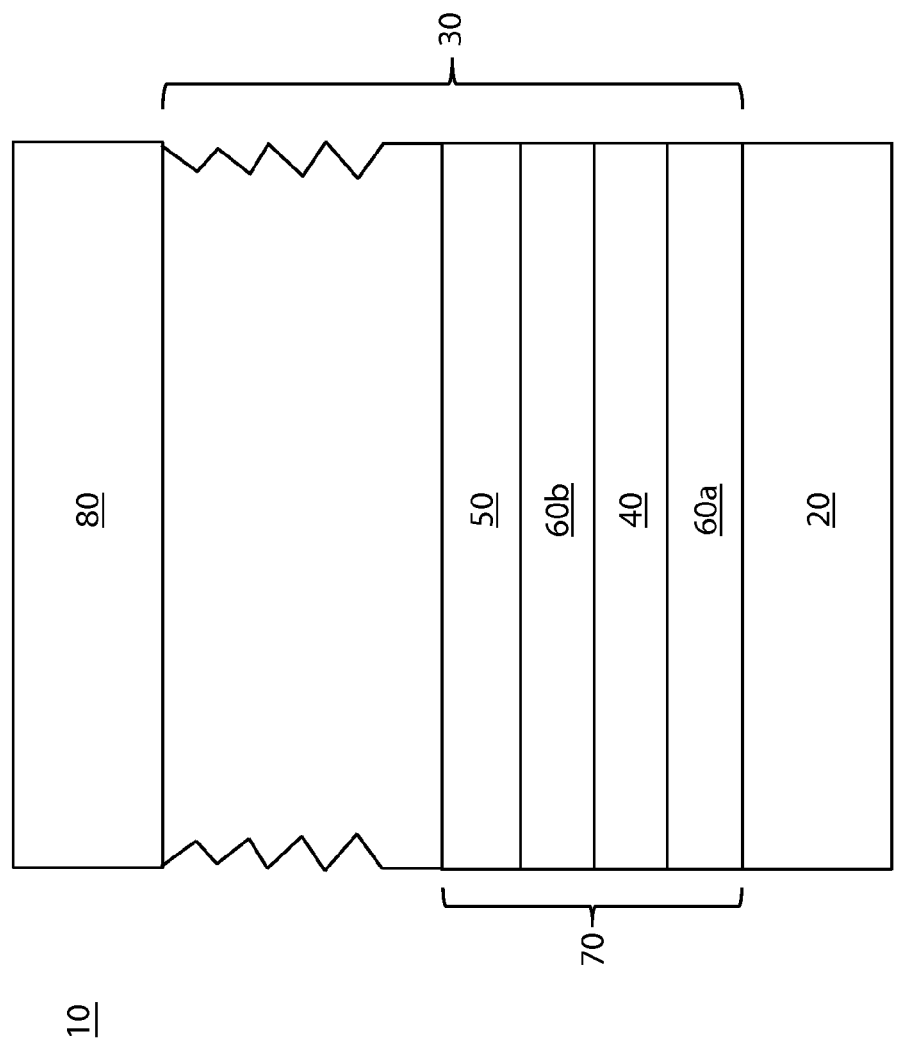

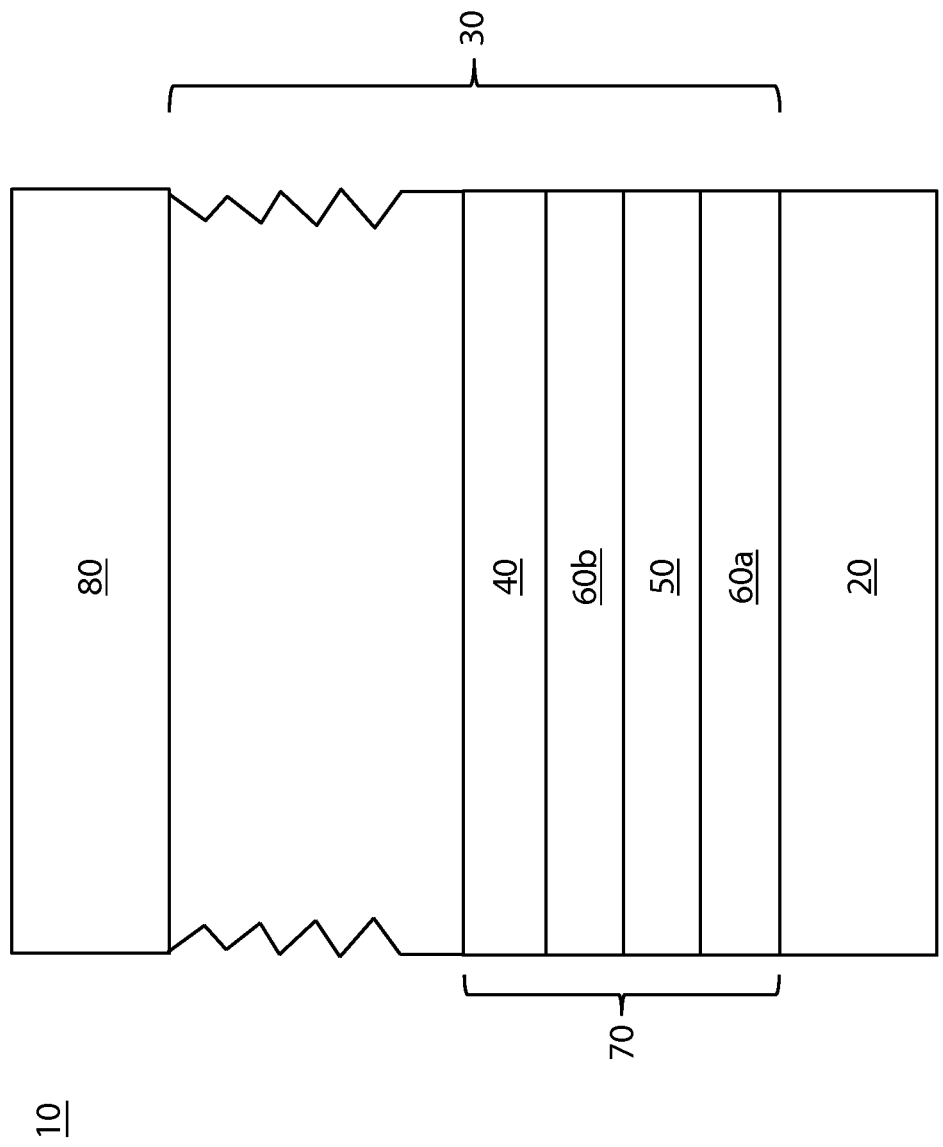

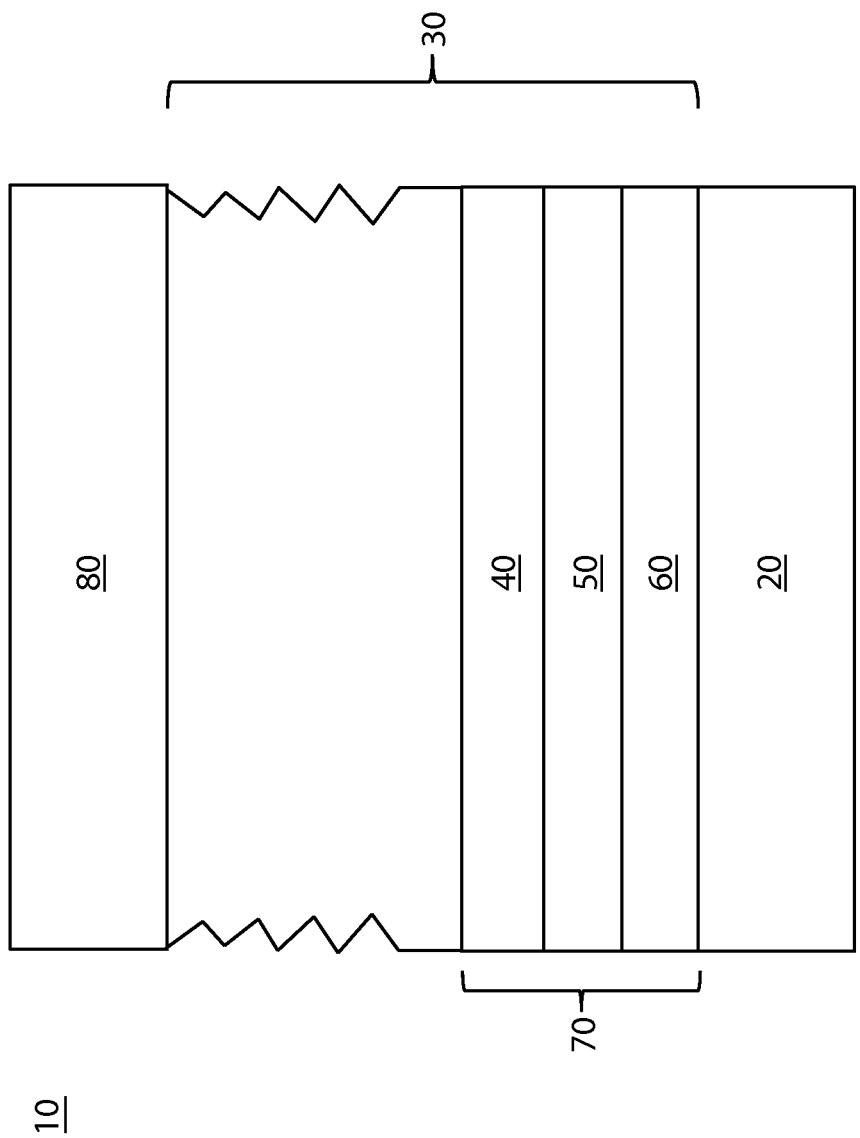

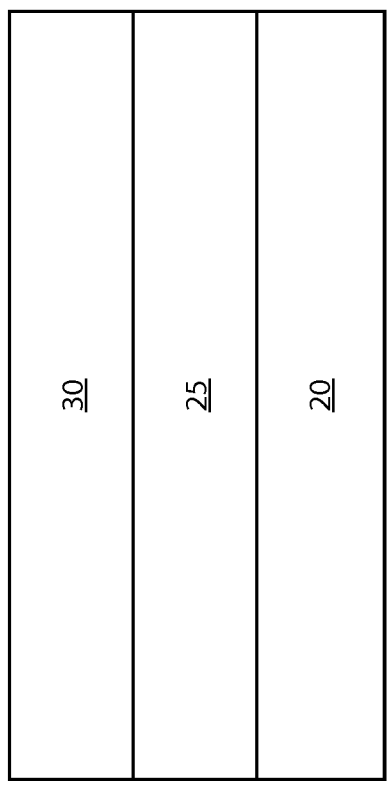

IN-SITU NITRIDATION OF GATE DIELECTRIC FOR SEMICONDUCTOR DEVICES

TECHNICAL FIELD

The disclosure relates to semiconductor substructures and methods for manufacturing the same. More particularly, the disclosure relates to semiconductor substructures, such as those including gate high-K dielectric thin films, with improved device performance and methods of making the same.

BACKGROUND

Metal oxide semiconductor devices are utilized throughout the electronics industry. A gate dielectric is generally formed between the semiconductor substrate and gate to increase gate capacitance and enhance device performance. Gate dielectrics can include films of silicon dioxide, other metal oxides and/or other dielectric materials. High-K metal gates have been used to improve performance.

BRIEF DESCRIPTION OF THE DRAWING

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawing.

FIG. 2 is a cross-sectional view of a semiconductor substructure in accordance with some embodiments.

FIGS. 3A-3D are cross-sectional views of semiconductor substructures in accordance with some embodiments.

FIG. 4 is a cross-sectional view of a semiconductor substructure in accordance with some embodiments.

DETAILED DESCRIPTION

The disclosure provides for forming improved substructures for metal oxide semiconductor (MOS) devices, such as metal oxide semiconductor field effect transistors (MOSFETs). In particular, the disclosure provides for forming higher quality gate dielectric films with an increased film dielectric constant (K) and reduced capacitance equivalent thickness (CET). An overview of the method used to form various semiconductor substructures according to the disclosure is provided in FIG. 1. Further details of the method and structures formed according to the methods are provided in conjunction with the accompanying figures.

Figure 1:
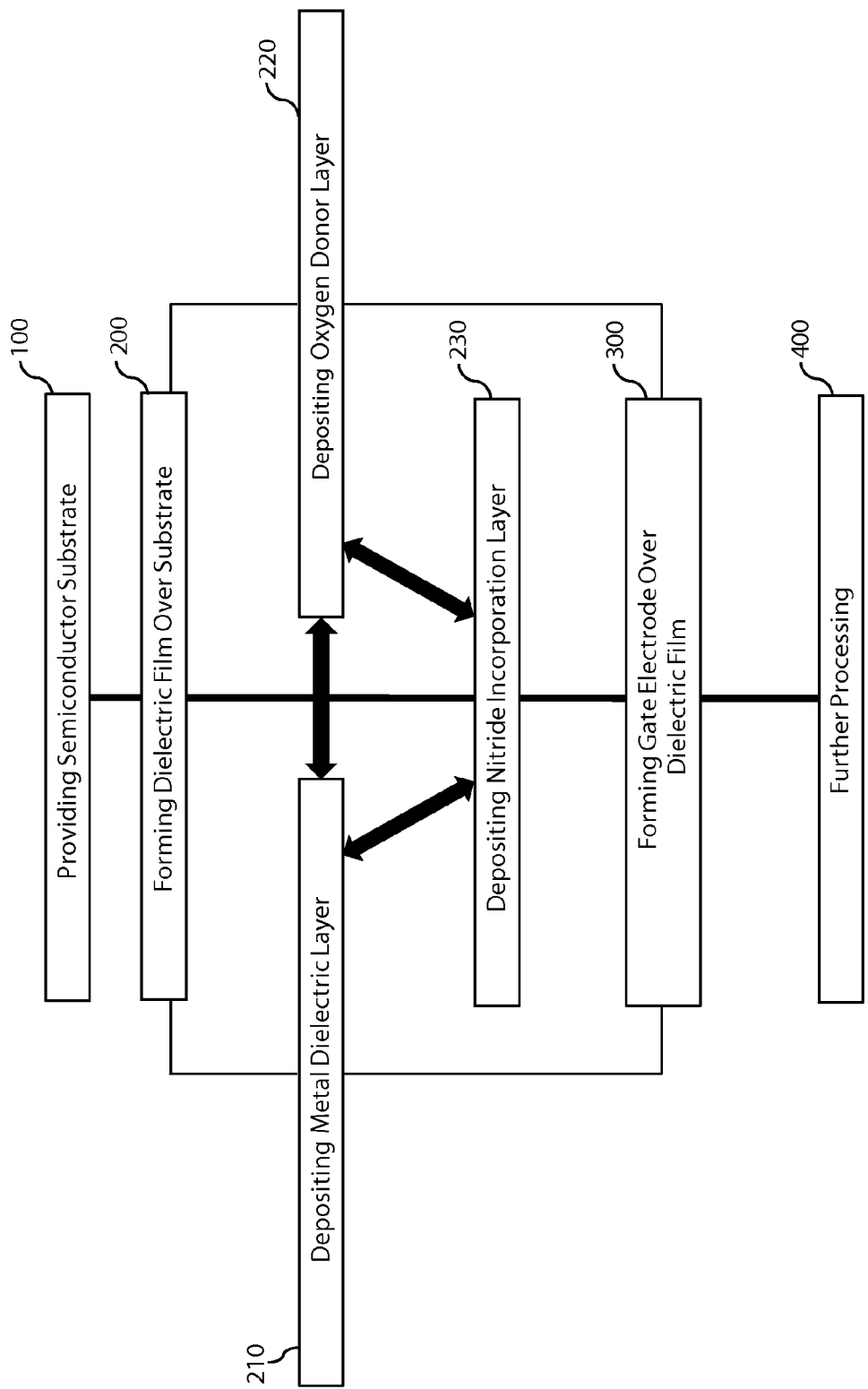
FIG. 1 is a flow chart showing an exemplary method of the disclosure.

In accordance with some embodiments, FIG. 1 is a flowchart describing a broad method for carrying out the formation of a semiconductor substructure. At step 100, a semiconductor substrate is provided. The semiconductor substrate can be silicon, including crystalline silicon, silicon on insulator, group III-V compound materials, or other suitable materials used as substrates in the manufacture of semiconductor devices. Step 200 provides for the formation of a dielectric film over the semiconductor substrate. The formation of the dielectric film includes substeps 210, 220 and 230 to incorporate in-situ nitridation with the deposition of multiple film layers of a continuous film.

At substep 210, at least one metal dielectric layer is deposited over the substrate. At substep 220, at least one oxygen-donor layer is deposited over the metal dielectric layer. At substep 230, at least one nitride-incorporation layer is deposited over the oxygen-donor layer. The sequence of substeps 210, 220 and 230 can vary and the sequence of substeps can be repeated to form the dielectric film. The dielectric film is continuous, having the metal dielectric, oxygen-donor and nitride-incorporation layers in a consecutive arrangement such that each of the metal dielectric layer, oxygen-donor layer and nitride-incorporation layer is adjacent or near another of the metal dielectric layer, oxygen-donor layer and nitride-incorporation layer. Further details of the method and application of substeps 210, 220 and 230 are provided in this description and the accompanying figures.

In some embodiments, step 300 provides for the formation of a gate electrode over the dielectric film. In some embodiments at step 400, the substructure can undergo additional processing operations and can be coupled to various other semiconductor substructures and structures to form any of the various integrated circuits, transistors and other types of semiconductor devices. For example, further processing may include formation of an inner spacer layer along the sides of the gate electrode; formation of spacers along sidewalls of the gate electrode; etching through the semiconductor material to form recesses adjacent to the gate electrode that extend under at least a portion of the spacer; and/or in-situ filling of the recesses with strain inducing material.

FIG. 2 is a cross-sectional view of a semiconductor substructure in accordance with some embodiments. The dielectric film 30 is formed over a substrate 20. The dielectric film 30 includes at least one metal dielectric layer 40, at least one oxygen-donor layer 50, and at least one nitride-incorporation layer 60. The metal dielectric layer 40 can be a high-K dielectric material in some embodiments or any suitable dielectric material in other embodiments. The high-K dielectric material can be, but is not limited to, compounds including halides or organic metallic compounds in some embodiments. In other embodiments, the high-K dielectric material can be a compound (e.g., metal oxide) containing elements such as aluminum (Al), zirconium (Zr), hafnium (Hf), yttrium (Y), tantalum (Ta), strontium (Sr), lanthanum (La), and combinations thereof. The metal dielectric layer 40 can be deposited using any suitable plasma or gaseous precursor in some embodiments.

The oxygen donor layer 50 can include any suitable oxygen donor material, such as oxygen. In some embodiments, the oxygen donor layer 50 can be deposited using any suitable plasma or gaseous precursor, such as, but not limited to, water ($H_2O$), ozone ($O_3$), oxygen ($O_2$), hydrogen peroxide ($H_2O_2$), and combinations thereof.

The nitride-incorporation layer 60 includes nitrogen. In some embodiments, the nitride-incorporation layer 60 can be deposited using any suitable plasma or gaseous precursor, such as, but not limited to, nitrogen ($N_2$), ammonia ($NH_3$), diimide ($N_2/H_2$), nitrous oxide ($N_2O$), and combinations thereof.

One or more of the metal dielectric 40, oxygen-donor 50, and nitride-incorporation layers 60 can be atomic monolayers. In some embodiments, the metal dielectric, oxygen-donor, and nitride-incorporation layers 40, 50, 60 can be deposited by atomic layer deposition (ALD) techniques. The layers 40, 50 and 60 can be deposited by other suitable techniques in other embodiments. The ALD techniques can be thermal or plasma-assisted. In some embodiments, the ALD technique can be remote plasma ALD (RD-ALD).

Depositing the layers 40, 50, 60 to form the dielectric film 30 can include depositing a metal dielectric precursor, an oxygen-donor precursor, and a nitride-incorporation precursor. The metal dielectric, oxygen-donor, and nitride-incorporation layers 40, 50, 60 are deposited in a sequence of alternating layers. In some embodiments, a nitride-incorporation layer 60 is deposited before a metal dielectric layer 40, a oxygen-donor layer 50, or both 40, 50. In some embodiments, a sequence 70 for depositing layers can be a cycle that is repeated. For example, a sequence 70 can be repeated at least twice, or a sequence 70 can also be repeated until the dielectric film 30 reaches a desired thickness. For example, a total thickness of the dielectric film 30 can range from 3-100 Å or from 3-30 Å or from 5-30 Å or from 3-60 Å or from 5-100 Å.

In some embodiments, the continuous dielectric film 30 is formed by multiple layers 40, 50, 60 including a plurality of nitride-incorporation layers 60. The plurality of nitride-incorporation layers 60 can be intermittent within the continuous dielectric film 30, e.g., two or more of the nitride-incorporation layers 60 are deposited non-consecutively. For example, after a nitride-incorporation layer 60 is deposited, one or more of the metal dielectric layers 40 and/or one or more of the oxygen-donor layers 50 is deposited before the next nitride-incorporation layer 60.

FIGS. 3A-3D are cross-sectional views of semiconductor substructures in accordance with some embodiments. The semiconductor substructure 10 can include a gate electrode 80 over the dielectric film 30.

In some embodiments, at least one of the nitride-incorporation layers 60 is deposited between at least one metal dielectric layer 40 and at least one oxygen-donor layer 50. For example, FIG. 3A is a cross-sectional view of a semiconductor substructure 10 with a dielectric film 30 formed with a sequence 70 that includes: (a) depositing a first nitride-incorporation layer 60a, followed by (b) depositing a metal dielectric layer 40, followed by (c) depositing a second nitride-incorporation layer 60b, followed by (d) depositing an oxygen-donor layer 50. FIG. 3B is a cross-sectional view of a substructure 10 with a dielectric film 30 formed with a sequence 70 that includes: (a) depositing a first nitride-incorporation layer 60a, (b) depositing an oxygen-donor layer 50, (c) depositing a second nitride-incorporation layer 60b, and (d) depositing a metal dielectric layer 40.

Figure 3D:
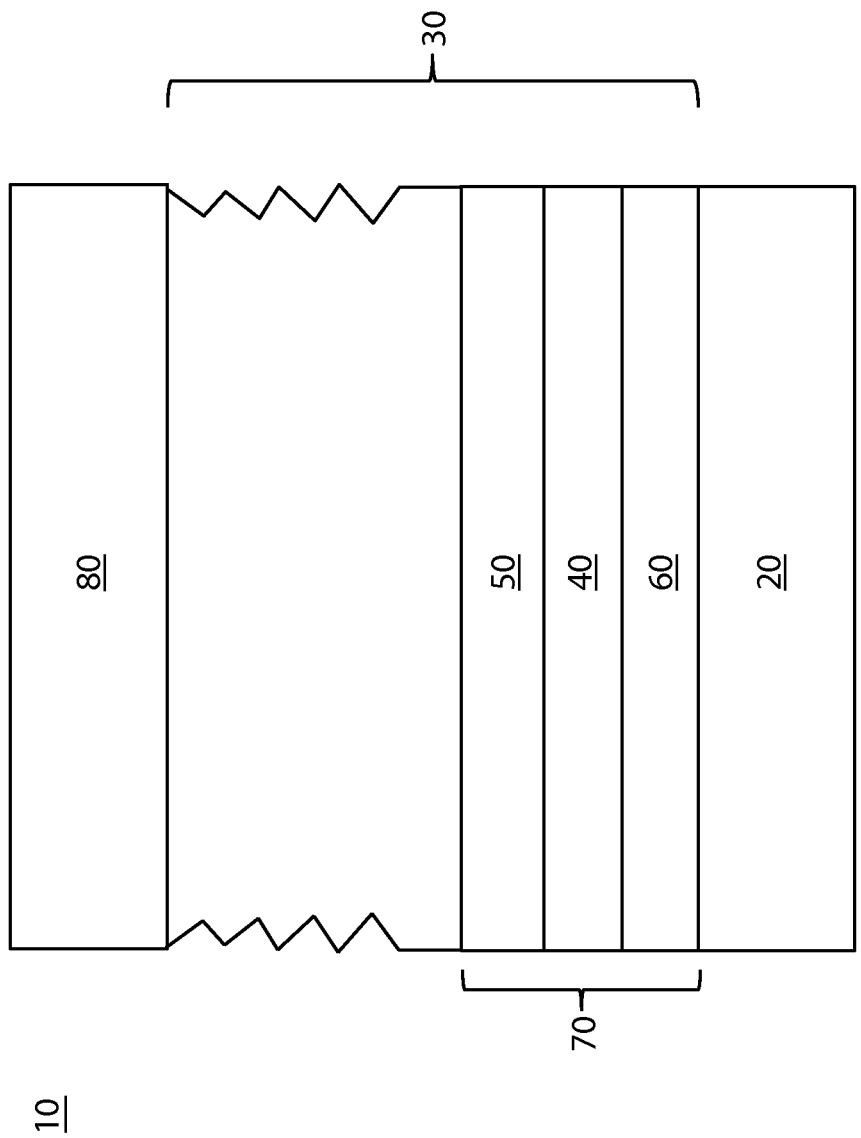

In other embodiments, a nitride-incorporation layer 60 is deposited before each of a metal dielectric layer 40 and an oxygen-donor layer 50. For example, FIG. 3C is a cross-sectional view of a semiconductor substructure 10 with a dielectric film 30 formed with a sequence 70 that includes: (a) depositing a nitride-incorporation layer 60, followed by (b) depositing an oxygen-donor layer 50, followed by (c) depositing a metal dielectric layer 40. FIG. 3D is a cross-sectional view of a substructure 10 with a dielectric film 30 formed with a sequence 70 that includes: (a) depositing a nitride-incorporation layer 60, (b) depositing a metal dielectric layer 40, and (c) depositing an oxygen-donor layer 50.

In a given sequence 70, each successive layer can be deposited on the previous layer. For example, layer (b) can be deposited on layer (a), layer (c) can be deposited on layer (b) and, if applicable, layer (d) can be deposited on layer (c). When the sequence 70 is repeated, the next layer (a) can be deposited on the final layer of the previous sequence, whether that is layer (c) or (d), and then the remainder of the sequence can be repeated.

In some embodiments, the dielectric film 30 can be formed over or on the substrate 20 as shown generally in FIGS. 2-3D. In other embodiments, the substrate 20 can include an optional oxide layer 25 over the substrate 20 and the dielectric film 30 can be formed over the substrate 20 and, where applicable, over or on the oxide layer 25 as shown generally in FIG. 4. The oxide layer 25 can be a native oxide, $SiO_2$, or another suitable oxide layer.

EXAMPLE

Selection of Nitride Precursor

A nitride precursor was selected based on a comparison of substructures. MOS capacitors were fabricated including $HfO_2$ gate dielectrics with no nitridation and post-nitridation with the nitride precursors $N_2$, $N_2/H_2$ and $NH_3$, using RD-ALD techniques under a RF power of 300 W on a $HfO_2$ thin film thickness of ~0.3 nm.

The electrical and chemical properties of this group of substructures was measured as follows:

| Nitridation | CET (nm) | $K_{eff}$ | Nitrogen (%) |
|---|---|---|---|
| None | 3 | 14.9 | — |
| $N_2$-300 W | 2.5 | 17.5 | 4 |
| $N_2/H_2$-300 W | 2.1 | 18 | 5 |
| $NH_3$-300 W | 1.9 | 20.9 | 5.3 |

The data indicated the highest quality gate dielectric (based on lowest CET and highest κ) using $NH_3$ as the nitride precursor.

Comparison with Example Substructures

For comparison, MOS capacitors were fabricated including $HfO_2$ gate dielectrics with no nitridation, $HfO_2$ gate dielectrics with post-nitridation using $NH_3$, and exemplary substructures using the layered dielectrics according to the disclosure. For all three groups, p-type Si(100) wafers with a resistivity of 1-10 cm were provided as substrates. The substrates were cleaned using the standard Radio Corporation of America (RCA) process and then immersed in a dilute hydrofluoric acid (1% HF) solution to remove the native oxide. The respective dielectric films were immediately deposited on the substrate. The various dielectric films were deposited using RD-ALD techniques with the precursors tetrakis (ethylmethylamino) hafnium (TEMAH, $Hf[N(C_2H_5)CH_3]_4$) and $O_2$ plasma. The remote $O_2$ plasma was generated under a RF power of 300 W. The RD-ALD used a 13.56 MHz RF power generator and deposition was carried out at 250° C. under a working pressure of $2\times10^{-1}$ Torr.

For the $HfO_2$ only and the control nitridation substructures, the precursors were cycled through a reaction chamber by an argon (Ar) carrier gas in the sequence: TEMAH→Ar purge→remote $O_2$ plasma→Ar purge. The cycle was repeated 60 times to deposit an $HfO_2$ layer (91). FIG. 5A is a schematic cross-sectional view of the substructure fabricated with $HfO_2$ only (hereinafter referenced as "S00").

For the control nitridation substructures of FIG. 5A, the nitridation process was then performed at a temperature of 250° C. for 3 minutes using a remote $NH_3$ plasma generated at 300 W RF power to deposit nitrogen (92). FIG. 5B is a schematic cross-sectional view of the substructure fabricated with post-nitridation (hereinafter referenced as "S01").

For the example substructures, $NH_3$ was used as a precursor for depositing the nitride incorporation layer and introduced into the deposition sequence as follows: remote TEMAH→Ar purge→remote $O_2$ plasma→Ar purge→$NH_3$ plasma→Ar purge. The nitridation process was performed at a temperature of 250° C. for 30 seconds using the remote $NH_3$ plasma generated at 300 W RF power. The cycle was repeated 10 times to form a layered dielectric.

Figure 5C:
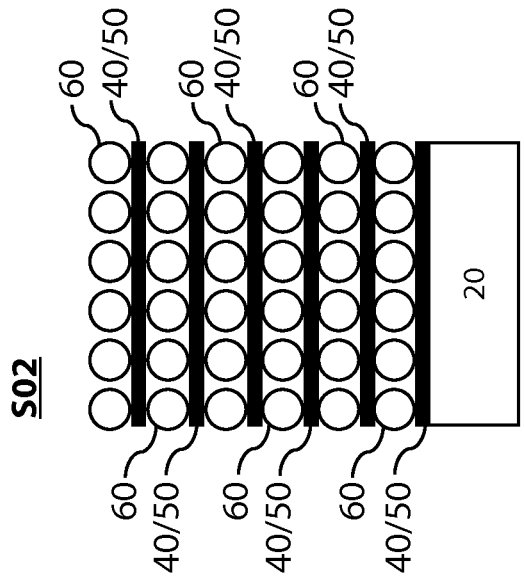
FIG. 5C is a cross-sectional view of a gate dielectric in accordance with an embodiment.
Figure 5B:
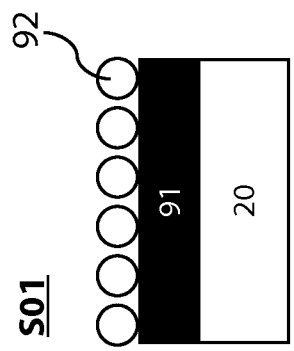
FIGS. 5A and 5B are cross-sectional views of gate dielectrics.
Figure 5A:
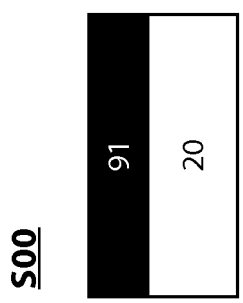

FIG. 5C is a schematic cross-sectional view of the example substructure (hereinafter referenced as "S02"). The dimensions of the dielectric films in FIGS. 5A-5C are depicted in an expanded view for clarity of the film components; however, the total thickness of each of the dielectric films could be about the same in some embodiments.

For all three groups S00, S01, S02, after formation of the dielectric films, platinum was deposited by magnetron sputtering upon the dielectric film through a shadow mask. Aluminum was also deposited on the backside of the Si substrates using thermal evaporation to form a back electrode for the MOS capacitors. The area of the $Pt/HfO_2/Si$ capacitors was $5 \times 10^{-3}$ $cm^2$.

Figure 6:
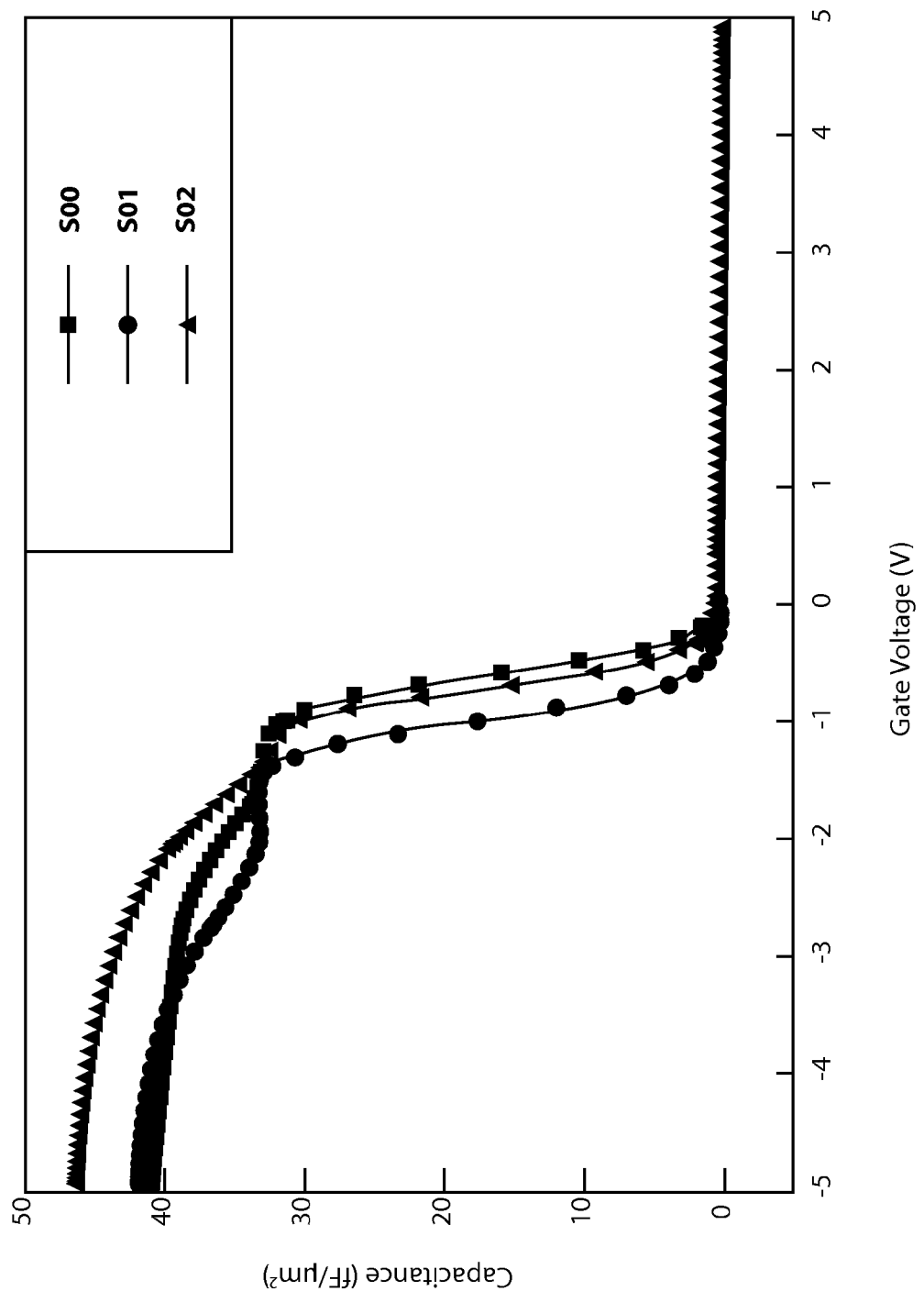
FIG. 6 is a chart showing data for capacitance of a semiconductor device in accordance with an embodiment compared with other gate dielectrics.

The electrical properties of the S00, S01, and S02 MOS capacitors were measured. FIG. 6 is a chart showing the capacitance relative to gate voltage for the three groups. Based on the data, the S02 film has a capacitance about 10% higher than S00 or S01.

A comparison of the electrical properties is summarized as follows:

| Dielectric Film Type | CET (nm) | $K_{eff}$ | $V_{FB}$ | $J_g(V_{FB} - 1 V)$ | $Q_{eff}$ |
|---|---|---|---|---|---|
| S00 | 0.84 | 27 | −0.1 | 1E−04 | 2.1E+13 |
| S01 | 0.82 | 27.5 | −0.55 | 1.8E−03 | 3.3E+13 |
| S02 | 0.74 | 31 | −0.3 | 1E−03 | 1.5E+13 |

From this data, it is evident that the S02 dielectric structures exhibit a lower CET and a higher dielectric constant than the comparable dielectric structures formed by other techniques.

Figure 7:
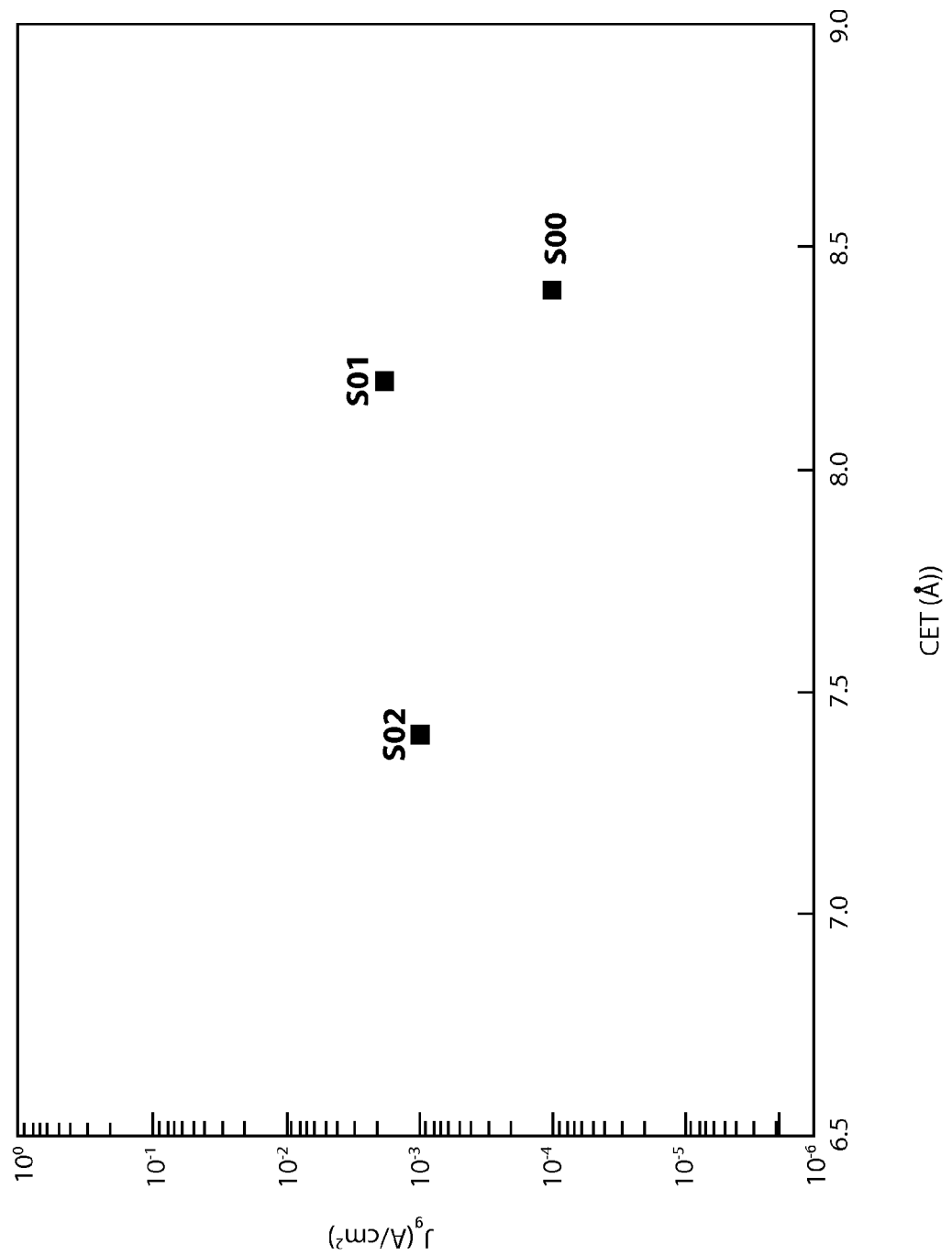
FIG. 7 is a chart of leakage current density versus capacitance equivalent thickness of a semiconductor device in accordance with an embodiment compared with other gate dielectrics.

FIG. 7 is a chart of leakage current density versus capacitance equivalent thickness of a gate dielectric in accordance with various embodiments compared with other gate dielectrics. The results demonstrate that the dielectric films described herein exhibit significantly improved performance.

Figure 8A:
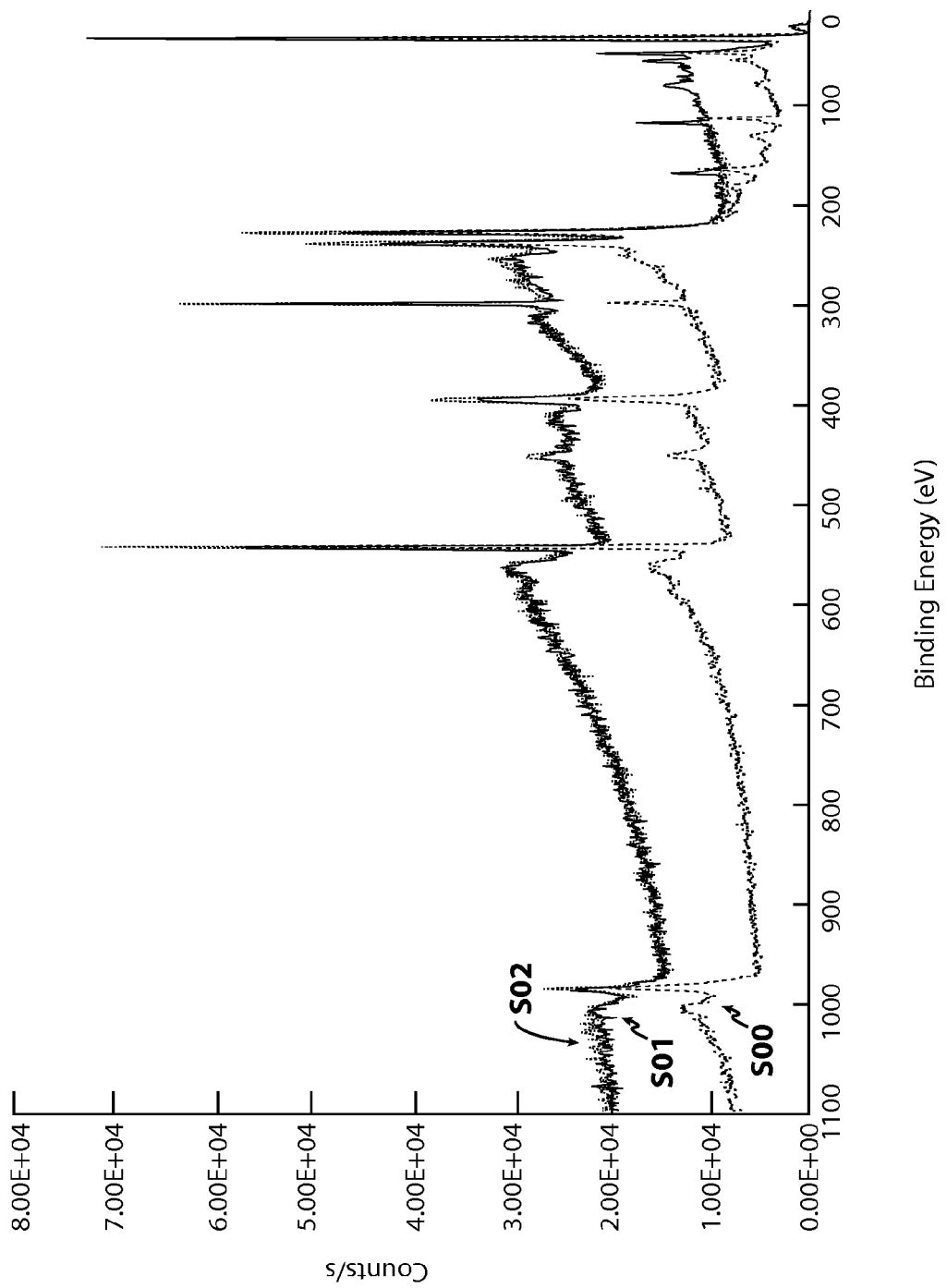
FIGS. 8A and 8B are XPS spectra showing chemical properties of a gate dielectric in accordance with an embodiment compared with other gate dielectrics.
Figure 8B:
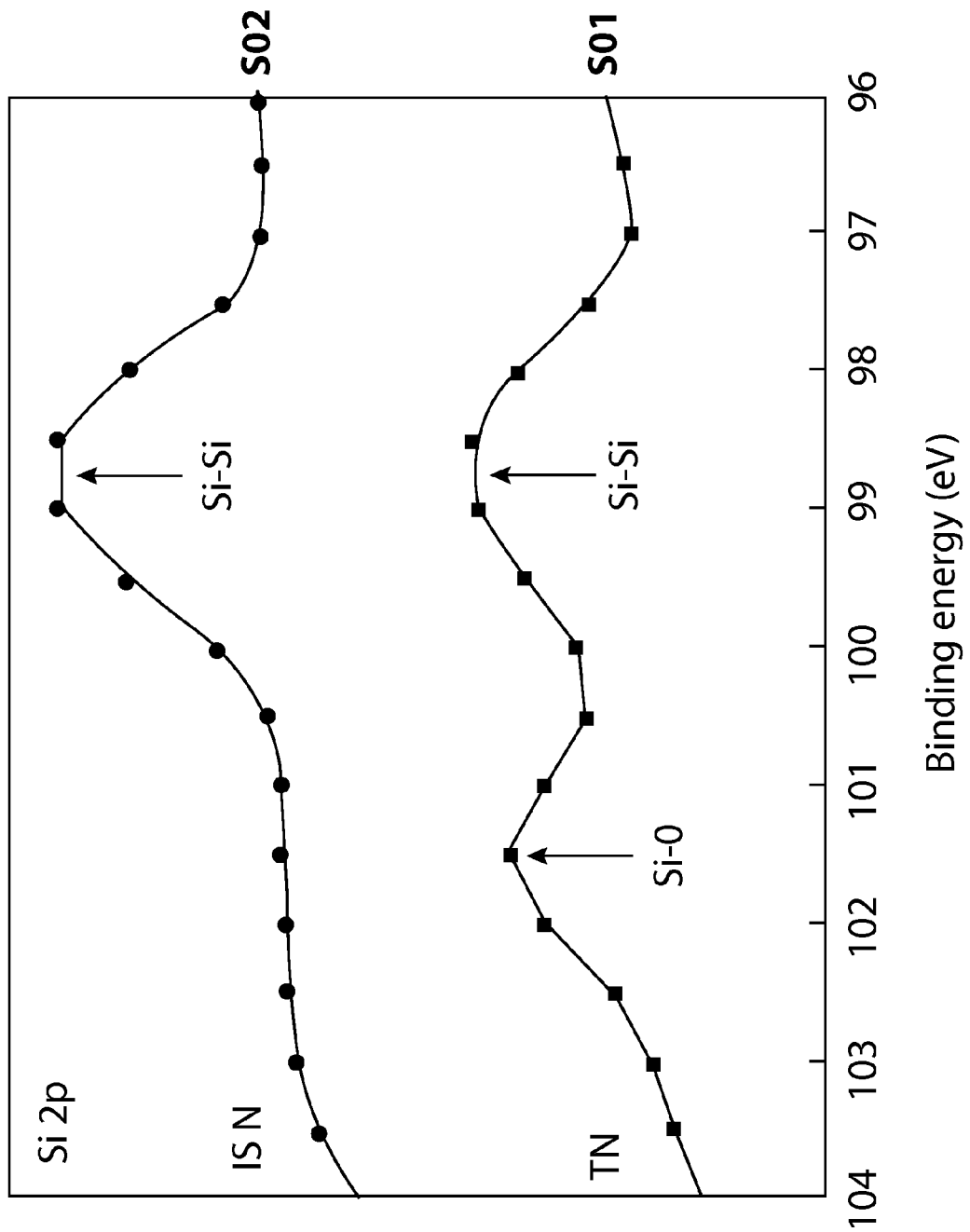

Additionally, the chemical properties of the S00, S01 and S02 MOS capacitors were measured via x-ray photon spectroscopy (XPS). FIG. 8A is the XPS survey spectrum for the three groups. FIG. 8B shows a subset of the XPS spectrum at the Si2p plasmon peak, in which the nitrogen signal was normalized to show the oxygen signal.

The XPS surface analysis is quantified as follows:

| Surface | S01 | S00 |
|---|---|---|
| N % | 4.5 | 4.1 |
| Hf % | 33.2 | 31.7 |
| O % | 62.3 | 64.2 |

The results demonstrate that the exemplary dielectric film has a lower oxygen signal and higher nitrogen signal than the control group. This demonstrates that the exemplary method produces dielectric films with improved deactivation of the oxygen vacancy ($V_o$).

In summary, the disclosure provides efficient and effective methods for forming improved semiconductor substructures with higher quality gate dielectrics. The substructures according to the disclosure have high uniformity and no surface saturated limitations. Additional advantages of the substructures include: significant reductions to leakage current in dielectric by deactivating the oxygen vacancy; suppression of crystallization and reduction of B penetration to achieve higher quality and higher dielectric constant film properties; and suppression of the interfacial layer thickness resulting in improved CET. Furthermore, the efficient one process system according to the disclosure reduces production time and equipment for wafer fabrication cost.

In some embodiments, a method for forming a semiconductor substructure is provided. The method can include providing a semiconductor substrate; and forming a continuous dielectric film over the semiconductor substrate by depositing at least one metal dielectric layer, depositing at least one oxygen-donor layer, and depositing at least one nitride-incorporation layer. At least one of the at least one nitride-incorporation layer is deposited before at least one of the at least one metal dielectric layer or at least one of the at least one oxygen-donor layer.

In some embodiments, the metal dielectric, oxygen-donor, and nitride-incorporation layers are deposited by atomic layer deposition.

In some embodiments, one of the metal dielectric layer and an oxygen-donor layer is deposited on the nitride-incorporation layer.

In some embodiments, depositing at least one nitride-incorporation layer includes depositing a plurality of intermittent nitride-incorporation layers.

In some embodiments, depositing the metal dielectric layer includes using a material selected from the group consisting of aluminum (Al), zirconium (Zr), hafnium (Hf), yttrium (Y), tantalum (Ta), strontium (Sr), and lanthanum (La).

In some embodiments, depositing the nitride-incorporation layer includes using a gas selected from the group consisting of nitrogen gas ($N_2$), ammonia ($NH_3$), diimide ($N_2/H_2$), and nitrous oxide ($N_2O$).

In some embodiments, depositing the oxygen-donor layer includes using a gas selected from the group consisting of water ($H_2O$), ozone ($O_3$), and oxygen gas ($O_2$).

In some embodiments, the dielectric film is formed in a sequence including: (a) depositing a first one of the at least one nitride-incorporation layer over the substrate, (b) depositing the metal dielectric layer over the first nitride-incorporation layer, (c) depositing a second one of the at least one nitride-incorporation layer over the metal dielectric layer, and (d) depositing the oxygen-donor layer over the second nitride-incorporation layer.

In some embodiments, the dielectric film is formed in a sequence including: (a) depositing a first one of the at least one nitride-incorporation layer over the substrate, (b) depositing the oxygen-donor layer over the first nitride-incorporation layer, (c) depositing a second one of the at least one nitride-incorporation layer over the oxygen-donor layer, and (d) depositing the metal dielectric layer over the second nitride-incorporation layer.

In some embodiments, the dielectric film is formed in a sequence including: (a) depositing the nitride-incorporation layer over the substrate, (b) depositing the oxygen-donor layer over the nitride-incorporation layer, and (c) depositing the metal dielectric layer over the oxygen-donor layer.

In some embodiments, the dielectric film is formed in a sequence including: (a) depositing the nitride-incorporation layer over the substrate, (b) depositing the metal dielectric layer over the nitride-incorporation layer, and (c) depositing the oxygen-donor layer over the metal dielectric layer.

In some embodiments, a method for forming a semiconductor substructure is provided. The method can include providing a semiconductor substrate having an oxide layer on an upper surface of the semiconductor substrate; forming a continuous dielectric film over the oxide layer by repeating a cycle including depositing at least one metal dielectric layer over the oxide layer, depositing at least one oxygen-donor layer over the oxide layer, and depositing at least one nitride-incorporation layer over the oxide layer; and forming a gate electrode over the dielectric film.

In some embodiments, a first one of the at least one nitride-incorporation layer is deposited before at least one of the first metal dielectric layer or the first oxygen-donor layer.

In some embodiments, a semiconductor substructure is provided. The semiconductor substructure can include a substrate; an oxide layer over the substrate; and a continuous dielectric film over the oxide layer. The continuous dielectric film includes at least one metal dielectric layer, at least one oxygen-donor layer, and at least one nitride-incorporation layer.

In some embodiments, at least one of the at least one metal dielectric layer, or at least one of the at least one oxygen-donor layer, or both are over the at least one nitride-incorporation layer.

In some embodiments, the at least one metal dielectric layer is on the at least one nitride-incorporation layer, which is on the at least one oxygen-donor layer.

In some embodiments, the at least one oxygen-donor layer is on the at least one nitride-incorporation layer, which is on the at least one metal dielectric layer.

In some embodiments, the at least one nitride-incorporation layer includes a plurality of nitride-incorporation layers within the continuous dielectric film.

In some embodiments, the dielectric film is disposed directly on the oxide layer.

In some embodiments, the semiconductor substructure includes a gate electrode over the dielectric film.

The descriptions of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The descriptions of the fabrication techniques for exemplary embodiments may be performed using any suitable commercially available equipment commonly used in the art to manufacture semiconductor devices, or alternatively, using future developed equipment and techniques.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor substructure, comprising:
    providing a semiconductor substrate; and
    forming a continuous dielectric film over said semiconductor substrate comprising:
        depositing at least one metal dielectric layer over the substrate,
        depositing at least one oxygen-donor layer over the substrate, and
        depositing at least two intermittent nitride-incorporation layers over the substrate, wherein each of said metal dielectric layer, oxygen donor layer, and nitride incorporation layers comprise monolayers and wherein at least one of said nitride-incorporation layers is deposited before at least one of said at least one metal dielectric layer or at least one of said at least one oxygen-donor layer.

2. The method as in claim 1, wherein said metal dielectric, oxygen-donor, and nitride-incorporation layers are deposited by atomic layer deposition.

3. The method as in claim 1, wherein one of said metal dielectric layer and said oxygen-donor layer is deposited on said nitride-incorporation layer.

4. The method as in claim 1, wherein depositing said nitride-incorporation layers comprises depositing more than two layers.

5. The method as in claim 1, wherein depositing said at least two nitride-incorporation layers comprises using a gas selected from the group consisting of nitrogen gas ($N_2$), ammonia ($NH_3$), diimide ($N_2/H_2$), and nitrous oxide ($N_2O$).

6. The method as in claim 1, wherein depositing said at least one metal dielectric layer comprises using a material selected from the group consisting of aluminum (Al), zirconium (Zr), hafnium (Hf), yttrium (Y), tantalum (Ta), strontium (Sr), and lanthanum (La).

7. The method as in claim 1, wherein depositing said at least one oxygen donor layer comprises using a gas selected from the group consisting of water ($H_2O$), ozone ($O_3$), and oxygen gas ($O_2$).

8. The method as in claim 1, wherein said dielectric film is formed in a sequence comprising:

(a) depositing a first one of said at least two nitride-incorporation layers over the substrate,
(b) depositing said metal dielectric layer over the first nitride-incorporation layer,
(c) depositing a second one of said at least two nitride-incorporation layers over the metal dielectric layer, and
(d) depositing said oxygen-donor layer over the second nitride-incorporation layer.

9. The method as in claim 1, wherein said dielectric film is formed in a sequence comprising:
(a) depositing a first one of said at least two nitride-incorporation layers over the substrate,
(b) depositing said oxygen-donor layer over the first nitride-incorporation layer,
(c) depositing a second one of said at least two nitride-incorporation layers over the oxygen-donor layer, and
(d) depositing said metal dielectric layer over the second nitride-incorporation layer.

10. The method as in claim 1, wherein said dielectric film is formed in a sequence comprising:
(a) depositing one of said nitride-incorporation layers over the substrate,
(b) depositing said oxygen-donor layer over the nitride-incorporation layer, and
(c) depositing said metal dielectric layer over the oxygen-donor layer.

11. The method as in claim 1, wherein said dielectric film is formed in a sequence comprising:
(a) depositing one of said nitride-incorporation layers over the substrate,
(b) depositing said metal dielectric layer over the nitride-incorporation layer, and
(c) depositing said oxygen-donor layer over the metal dielectric layer.

12. The method as in claim 1, wherein said dielectric film is formed in a sequence comprising:
(a) depositing one of said nitride-incorporation layers over the substrate,
(b) depositing said metal dielectric layer over the nitride-incorporation layer,
(c) depositing said oxygen-donor layer over the metal dielectric layer; and
(d) depositing a second of said nitride-incorporation layers over said oxygen-donor layer.

13. A method for forming a semiconductor substructure, said method comprising:
providing a semiconductor substrate comprising an oxide layer on an upper surface of said semiconductor substrate;
forming a continuous dielectric film over said oxide layer by repeating a cycle comprising:
depositing at least one metal dielectric layer over said oxide layer,
depositing at least one oxygen-donor layer over said oxide layer, and
depositing at least two intermittent nitride-incorporation layers over said oxide layer, wherein a first one of the nitride-incorporation layers is deposited before at least one of the first metal dielectric layer or the first oxygen-donor layer, and wherein each of said metal dielectric layer, oxygen donor layer, and nitride incorporation layers comprise monolayers; and
forming a gate electrode over said dielectric film.

14. A method for forming a semiconductor substructure, comprising:
providing a semiconductor substrate;
forming a continuous dielectric film over said semiconductor substrate comprising:
depositing a metal dielectric layer over the substrate,
depositing an oxygen-donor layer over the substrate,
depositing a nitride-incorporation layer over the substrate, and
repeating each of said depositing steps at least once, wherein at least one of said at least one nitride-incorporation layers is deposited before at least one of said at least one metal dielectric layer or at least one of said at least one oxygen-donor layer, and wherein each of said metal dielectric layer, oxygen donor layer, and nitride incorporation layers comprise monolayers.

15. The method as in claim 14, wherein repeating said depositing steps forms a plurality of intermittent metal dielectric layers, a plurality of intermittent oxygen-donor layers, and a plurality of intermittent nitride-incorporation layers.

16. The method as in claim 14, wherein at least 3 intermittent nitride-incorporation layers are formed.

17. The method as in claim 14, wherein at least 5 intermittent nitride-incorporation layers are formed.

18. The method as in claim 14, wherein at least 10 intermittent nitride-incorporation layers are formed.

19. The method as in claim 14, further comprising forming an oxide layer on an upper surface of said semiconductor substrate.

20. The method as in claim 14, further comprising forming a gate electrode over said continuous dielectric film.

21. The method as in claim 14, wherein:
depositing said nitride-incorporation layer comprises using a gas selected from the group consisting of nitrogen gas ($N_2$), ammonia ($NH_3$), diimide ($N_2/H_2$), and nitrous oxide ($N_2O$);
depositing said metal dielectric layer comprises using a material selected from the group consisting of aluminum (Al), zirconium (Zr), hafnium (Hf), yttrium (Y), tantalum (Ta), strontium (Sr), and lanthanum (La); and
depositing said oxygen donor layer comprises using a gas selected from the group consisting of water ($H_2O$), ozone ($O_3$), and oxygen gas ($O_2$).

* * * * *